(12) United States Patent
Chang et al.

(10) Patent No.: US 7,344,938 B2
(45) Date of Patent: Mar. 18, 2008

(54) METHOD OF FABRICATING MEMORY

(75) Inventors: Kent Kuohua Chang, Taipei (TW); Jongoh Kim, Hsinchu (TW); Yider Wu, Taipei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 11/745,059

(22) Filed: May 7, 2007

(65) Prior Publication Data

US 2007/0259493 A1    Nov. 8, 2007

Related U.S. Application Data

(63) Continuation of application No. 11/138,612, filed on May 25, 2005, now Pat. No. 7,229,876.

(51) Int. Cl.
*H01L 21/8244* (2006.01)
(52) U.S. Cl. .............................. 438/238; 257/E21.158; 257/E21.503; 257/E21.597

(58) Field of Classification Search ................. 438/238; 257/E21.022, E21.158, E21.503, E21.597
See application file for complete search history.

(56) References Cited

U.S. PATENT DOCUMENTS

| 6,248,623 | B1 * | 6/2001 | Chien et al. ................. 438/241 |
| 7,166,510 | B2 * | 1/2007 | Lee ............................. 438/257 |
| 2006/0138463 | A1 * | 6/2006 | Kim et al. ................... 257/202 |

* cited by examiner

*Primary Examiner*—Michael Lebentritt
*Assistant Examiner*—Thu-Huong Dinh
(74) *Attorney, Agent, or Firm*—J.C. Patents

(57) ABSTRACT

A method of fabricating a memory device is described. During the process of forming the memory cell area and the periphery area of a semiconductor device a photoresist layer is formed on the memory cell area before the spacers are formed on the sidewalls of the gates. Therefore, the memory cell area is prevented from being damaged to mitigate the leakage current problem during the process of forming spacers in the periphery circuit area.

20 Claims, 10 Drawing Sheets

METHOD OF FABRICATING MEMORY

CROSS-REFERENCE TO RELATED APPLICATION

This application is a continuation application of, and claims the priority benefit of, U.S. application Ser. No. 11/138,612 filed on May 25, 2005 now U.S. Pat. No. 7,229,876.

BACKGROUND OF THE INVENTION

1. Field of the Invention

The present invention generally relates to a fabricating method for semiconductor devices. More particularly, the present invention relates to a fabrication method for memory devices.

2. Description of Related Art

Memory is a kind of semiconductor device for storage of information or data. Along with the fast development in Ultra-Large Scale Integration (ULSI) industry in the recent years, the more powerful of the microprocessor, the demand for software to program and calculating data is higher.

FIG. 1 illustrates a schematic diagram for a memory array fabricated by the method well known in the art. In FIG. 1 includes at least word line 102, word line 104, and bit line 112 and bit line 114. During the integration of the memory cell area and peripheral circuit area of the memory device, in order to form a spacer on the side walls of the gate in the peripheral circuit area, an insulating material layer is formed over the substrate, followed by an etching process to remove a portion of the insulation material layer to form the spacer. However, absent of any protection to memory cell area, defects are generated in the memory cell area 120 due to the etching process as shown in FIG. 1, wherein a portion of insulating material layer is removed. Consequently, current leakage between bit line 112 and bit line 114 may occur and affect the device reliability.

Furthermore, while a silicon oxide material is used as the material for the insulation material layer, an over-etching also is easily happened to inflict damages upon the bit line, the word line and the gate area on the surface of the memory structure. Consequently, the reliability of the device is compromised.

SUMMARY OF THE INVENTION

Broadly speaking, the present invention provides a fabricating method for a memory in which a current leakage is prevented.

Accordingly, the present invention is directed to a fabricating method of memory to improve the reliability of the memory device.

In accordance with one aspect of the present invention, a substrate, which is divided into memory cell area and peripheral circuit area, is provided. The memory cell area already includes a memory array formed therein, while the peripheral area includes at least a first active and a second active area, wherein the two active areas are formed with many gate structures. Then, a dielectric layer is formed on the substrate to cover the gate structures. Thereafter, a patterned photoresist layer is formed over the substrate to cover the memory cell area and the second active area. A part of the dielectric layer is further removed from the first active area, and the first spacers are formed on the side walls of the gate structures in the first active area. Within the first active area, a first source region and a first drain region are formed in the substrate beside the two side walls of the gate structures. The first patterned photoresist layer is subsequently removed. A second photoresist layer is formed over the substrate to cover the memory cell area and the first active area. A part of the dielectric layer is then removed from the second active area to form the second spacers on the side walls of the gate structures in the first active area. Within the second active area, a second source region and a second drain region are formed in the substrate beside the two side walls of the gate structures. Thereafter, the second patterned photoresist layer is removed.

In accordance with another aspect of the present invention, a method for fabricating a memory device is provided. A substrate, which is divided into a memory cell area and a peripheral circuit area, is provided. A memory array is formed in the memory cell area, while at least a first active area and a second active area formed with many gate structures in the peripheral circuit area. Then, a dielectric layer is formed on the substrate to cover the gate structures. Thereafter, a patterned photoresist layer is formed over the substrate to cover the memory cell area. A part of the dielectric layer is removed from the first active area to form the first spacers on the side walls of the gate structures in the first active area. After removing the first patterned photoresist layer, a second patterned photoresist is formed to cover the memory cell area and the second active area. A first source region and a first drain region are formed in the substrate beside the two side walls of the gate structures in the first active area. The second patterned photoresist layer is subsequently removed. Thereafter, a third patterned photoresist layer is formed over the substrate to cover the memory cell area and the first active area. Within the second active area, a second source region and a second drain region are formed in the substrate beside the two side walls of the gate structures. The third patterned photoresist layer is removed.

According to an embodiment of the present invention, the above mentioned fabricating method for a memory further comprises forming a pad oxide layer before the dielectric layer is form on the substrate.

According to an embodiment of the above mentioned fabricating method for the memory of the present invention, the material for the pad oxide layer is comprised of silicon dioxide, in which tetraethoxysilane (TEOS) is applied as a reacting gas.

According to an embodiment of the above mentioned fabricating method for a memory of the present invention, the method for removing a portion of dielectric layer from the first active area includes performing an anisotropic etching.

According to an embodiment of the above mentioned fabricating method for a memory of the present invention, the method for removing a portion of dielectric layer from the second active area includes performing an anisotropic etching.

According to an embodiment of the above mentioned fabricating method for a memory of the present invention, the above mentioned fabrication method for the memory, the material for the dielectric layer includes silicon nitride.

According to an embodiment of the above mentioned fabricating method for a memory of the present invention, before the dielectric layer is formed on the substrate, the above mentioned fabrication method for the memory further comprises of forming a layer of pad oxide on the substrate to cover the gate structure.

According to an embodiment of the above mentioned fabricating method for a memory of the present invention, the method for forming the first source region and the first drain region inside the substrate is the ion implantation.

According to a preferred embodiment of the present invention as above mentioned fabricating method for the memory, the method for forming the second source region and the second drain region in the substrate includes performing an ion implantation.

According to an embodiment of the above mentioned fabricating method for the memory of present invention, the first conducting type is a P type or an N type.

According to an embodiment of the above mentioned fabricating method for a memory of the present invention, the second conducting type is a P type or an N type.

According to an embodiment of the above mentioned fabricating method for a memory of the present invention, is the method further includes forming an isolation structure between two adjacent active areas.

According to an embodiment of the above mentioned fabricating method for the memory of the present invention, is the method further includes forming silicide on each gate structure.

According to an embodiment of the above mentioned fabricating method for a memory of the present invention, each gate structure is further comprised of a gate dielectric layer and a gate.

According to the present invention, the spacers are formed on the side walls of the gate structures during the formation of the source/drain region of the N type of metal oxide semiconductor (NMOS) or the P type of metal oxide semiconductor (PMOS). By applying the patterned photoresist layer to cover the memory cell area, the current leakage between the bit lines, which is normally caused by the damage inflicted upon the area between the bit lines and word lines, can be avoided. Noteworthy in particular, the process for forming the spacers and the process of implanting ions for forming the source/drain regions of the NMOS or PMOS are integrated together, in which the mask used is simply the mask for forming the source/drain regions of NMOS or PMOS in the complementary metal oxide semiconductor (CMOS) process.

In addition, a pad oxide layer is formed before the formation of dielectric layer to act as an etching stop layer; therefore an over-etching on the devices can be avoided during the etching process.

Besides, according the present invention, the photoresist layer is formed over the memory cell area as a protection before the spacer is formed in the peripheral circuit area of the semiconductor device. As a result, the current leakage between the bit lines which is normally caused by the damage induced during the etching process for the memory cell area can be avoided.

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
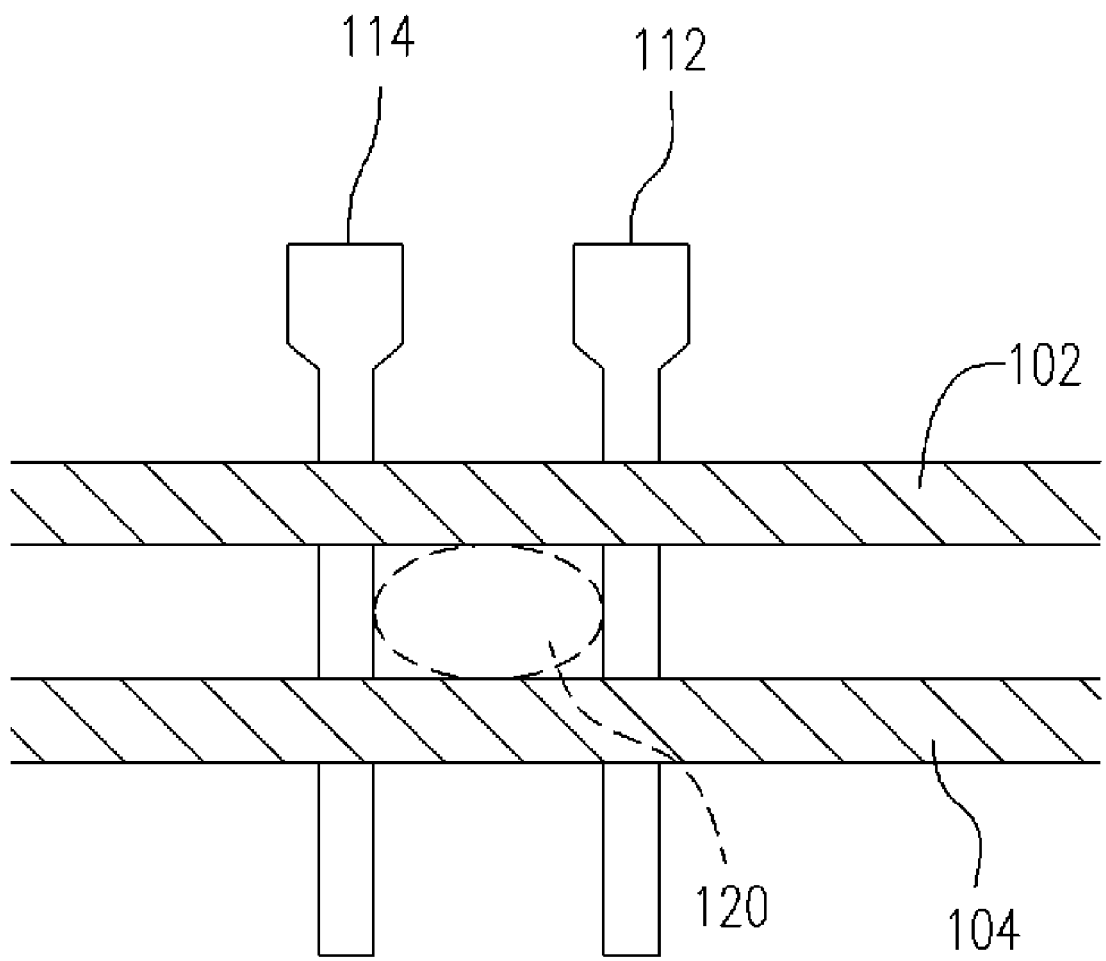
FIG. 1 is a schematic diagram illustrating a conventional memory cell.
Figure 2A:
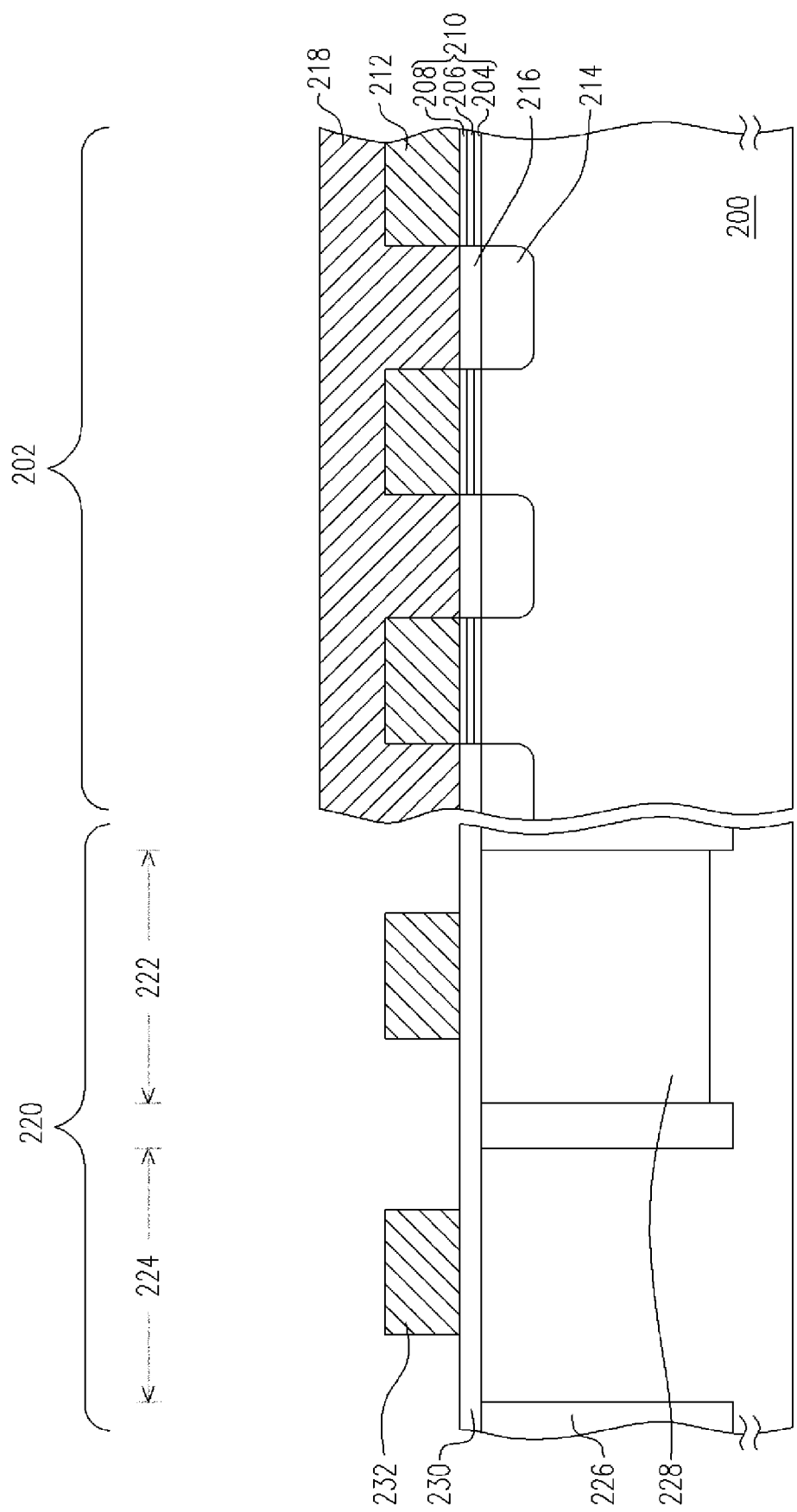
FIG. 2A~FIG. 2D are the cross sectional views showing the steps for fabricating a memory device according to one embodiment of the present invention.

FIG. 2A~FIG. 2D are the cross sectional views showing the steps for fabricating a memory cell according to one embodiment of the present invention. Referring to FIG. 2A, a substrate 200, for example, a P type silicon substrate is provided. Further, a memory cell area 202 and peripheral circuit area 220 are formed on the substrate 200. In the memory cell area 202, for example, a composite dielectric layer 210, control gates 212, buried doping regions 214, a dielectric layer 216 and a word line 218 are formed. In addition, within the peripheral circuit area 214, an isolation structure 226, an N type of well 228, a gate dielectric layer 230 and the gates 232 are formed, for example. Besides, a plurality of active areas 222, 224 is divided by the isolation structure 226, wherein the isolation structure includes but not limited to a shallow trench isolation structure.

The structure in FIG. 2A is formed by forming a composite dielectric layer 210 on the substrate 200 having an isolation structure 226 and a N type well 228 already formed therein. The composite dielectric layer 210 includes a bottom dielectric layer 204, a charge trapping layer 206 and a top dielectric layer 208, wherein the bottom dielectric layer 204 is silicon oxide layer, for example and the formation method includes but not limited to thermal oxidation. Regarding the charge trapping layer 206, the material used in forming the charge trapping layer can be a silicon nitride layer, and the formation method can be, for example, chemical vapour deposition. However, other materials, such as siliconoxynitride can be applied to the charge trapping layer 206. The material used for the top dielectric layer 208 can be, for example, silicon oxide, and the formation method can be, for example, thermal oxidation or chemical vapour deposition. Methods for forming the isolation structure 226 and the N type well region are well known to those skilled in the art, and will not be further described herein.

Thereafter, a patterned photoresist layer (not labelled in the figures) is formed on the composite dielectric layer 210 as a mask to process etching, then removing the composite dielectric layer 210 on the peripheral circuit area 220. Thereafter, a gate dielectric layer 230 is formed on the silicon dioxide, the method for the formation can be thermal oxidation. Then, a conducting layer (not shown in the figures) is formed on the composite dielectric layer 210 and the gate dielectric layer 230. The materials of the conducting layer includes a doped polysilicon layer and the formation method includes in-situ doping using chemical vapour deposition, or forming an undoped polysilicon layer followed by an ion implantation process. Thereafter, the conducting layer is patterned to form a control gate 212 in the memory cell area 202 and a gate 232 in the peripheral circuit area 220. According to another embodiment, a silicide (not shown in the figures) is formed above the gate 232 and the control gate 212 to reduce the resistance.

Referring next to FIG. 2A, a part of composite dielectric layer 210 not covered by the control gates 212 is removed. Thereafter, the buried doped regions 214 serving as bit lines are formed by, for example, ion implantation in parts of semiconductor substrate 200 exposed by each control gate 212. Furthermore, a dielectric layer 216 is formed above parts of semiconductor substrate 200 exposed by each control gate 212, and the material of the dielectric layer 216 can be, for example, silicon oxide, formed by, for example, thermal oxidation. Subsequently, the word line 218 is formed in the memory cell area 202, and the material of the word line can be, for example, formed by any methods in forming another conducting material layers (not shown in the figures), followed by a patterning process.

Figure 2B:
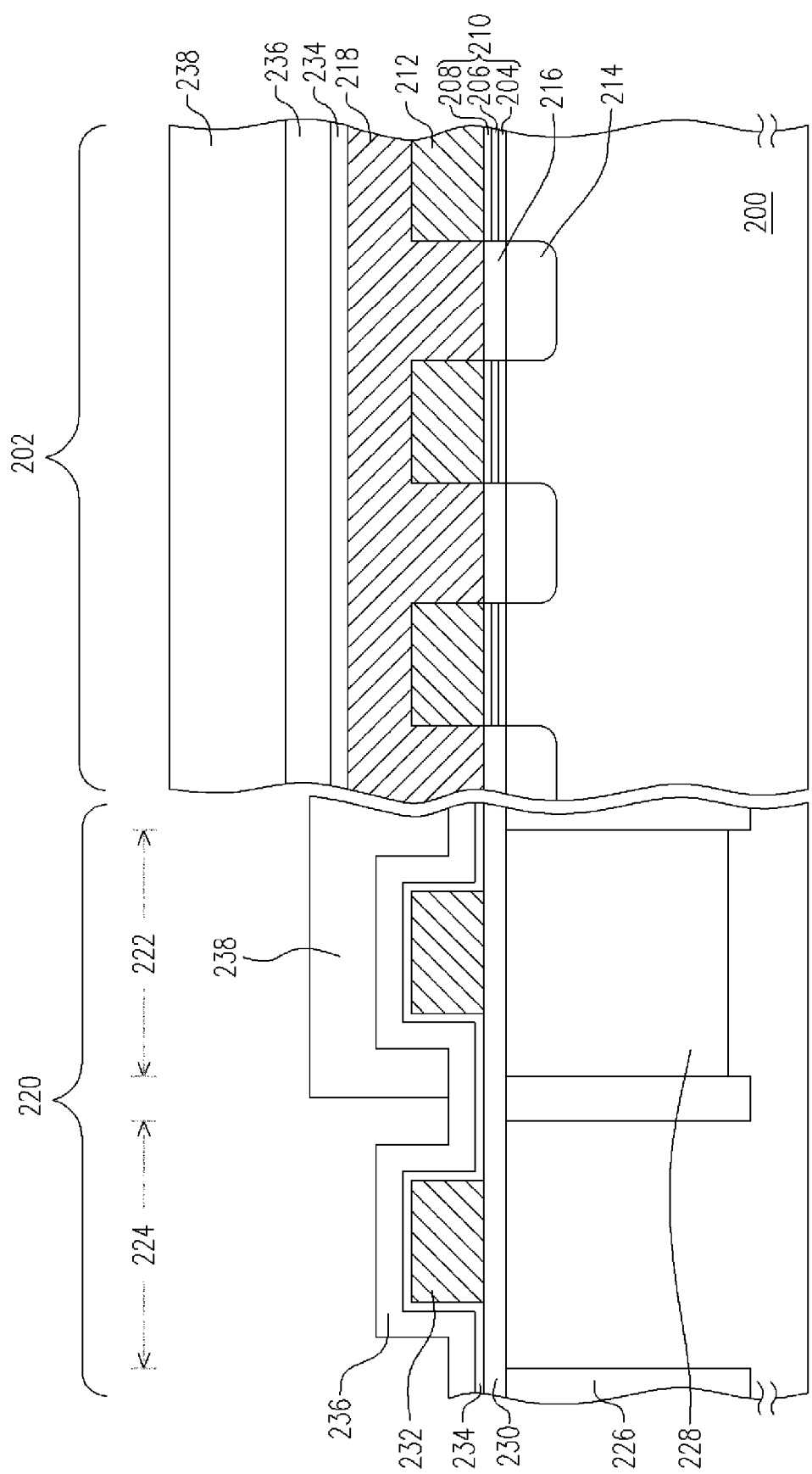

Continuing to FIG. 2B, a pad oxide layer 234 is formed on the semiconductor substrate 200 to cover word line 218 in the memory cell area 202, and gate 232 and gate oxide layer 230 in the peripheral circuit area 220, wherein the material of pad-oxide layer 234 can be silicon oxide, which is formed with the reacting gas tetraethoxysilane (TEOS) by chemical vapour deposition. Then, a patterned photoresist 238 is formed to cover the memory cell area 202 and the active area 222.

Figure 2C:
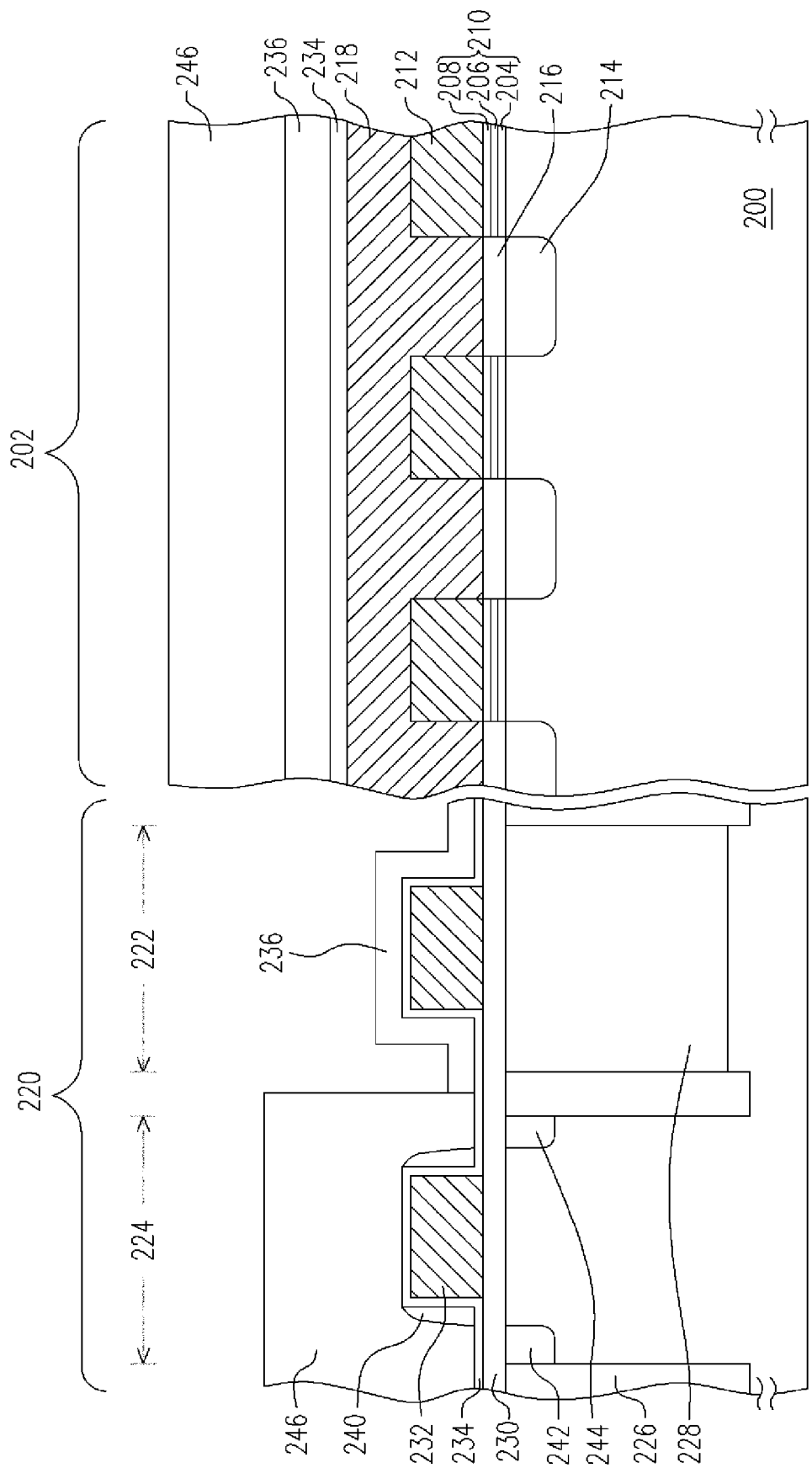

Referring now to FIG. 2C, the spacer 240 is formed on the side walls of each gate 232 within the active area 224 by removing a portion of the dielectric layer 236 in the active area 224. The method to remove the portion of the dielectric layer 236 is, for example, performing an anisotropic etching using the pad oxide layer 234 as an etching stop layer. Within the active area, an N type source region 242 and an N type drain region 244 are formed beside the two side walls of each gate 232 in the semiconductor substrate 200, through an ion implantation process. Thereafter, the patterned photoresist layer 238 is removed, and a patterned photoresist layer 246 is formed over the semiconductor substrate 200 to cover the memory cell area 202 and the active area 224.

Figure 2D:
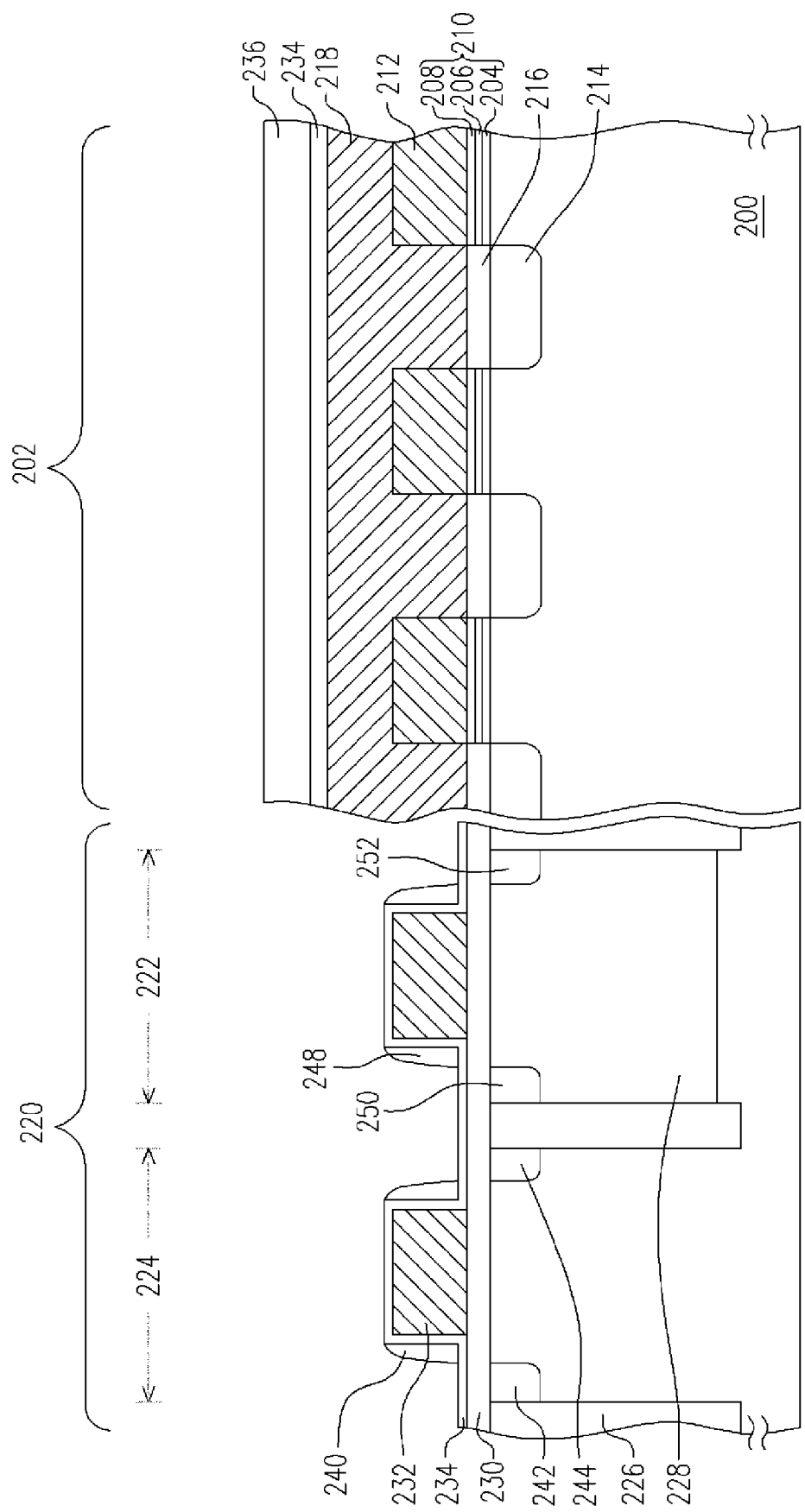

Referring to FIG. 2D, a portion of the dielectric layer 236 is removed from active area 222, by performing an anisotropic etching process using the pad oxide layer 234 as an etching stop layer. In the active area 222, the spacer 248 is formed on the side walls of each gate 232, followed by the formation of the P-type source region 250 and the P-type drain region 252 through ion implantation. Thereafter, the patterned photoresist layer 246 is removed. The following steps for the formation of memory device are well known to those skilled in the art; therefore, no further description is provided hereinafter.

According to the above embodiments, once the dielectric layer 236 is formed, the spacer 240, the N-type source region 242 and the N-type drain region 244 are formed in the active area 224. The spacer 248, the P type source region 250 and the P type drain region area 252 are further formed in the active region 222. In the above processing steps, patterned photoresist layers 238 and 246 cover the memory cell area 202; therefore, any damage that may inflict upon the region between the bit lines and word line, leading to a current leakage between the bit lines, can be avoided. Accordingly, a pad oxide layer 234 formed before the formation of the dielectric layer 236 as an etching stop layer can prevent the damage that may inflict upon the devices during the etching process. Further, the formation of the spacers 240 and 248 and the ion implantation for the formation of the N-type source region 242/N-type drain region 244 for the NMOS or the formation of the P-type source region 250/P-type drain region 252 for the PMOS can be integrated together. The CMOS fabrication process can be applied to form the patterned photoresist layers 238 and 246 for the NMOS or the PMOS; therefore, no additional cost required.

Figure 3A:
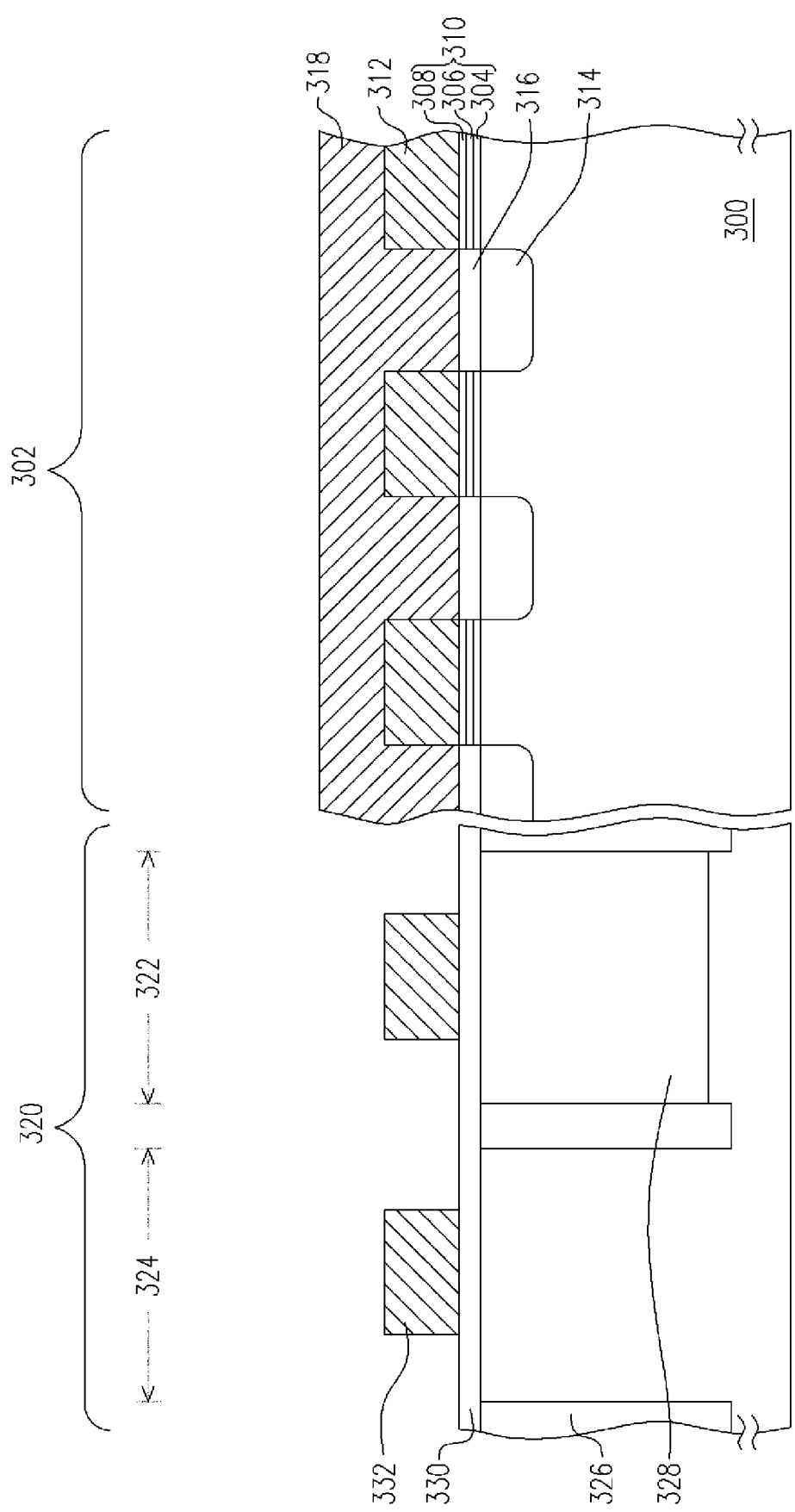
FIG. 3A~FIG. 3E are the cross sectional views showing the steps for fabricating a memory cell according to another embodiment of the present invention.

With reference to FIG. 3A~FIG. 3E, a fabricating process for a memory device according to another embodiments of the present invention is illustrated from the cross sectional views. As shown in FIG. 3A, a semiconductor substrate 300, for example, a P-type silicon substrate, is provided, wherein the semiconductor substrate 300 is already formed with a memory cell area 302 and a peripheral circuit area 320. The memory cell area 302 is comprised of, for example, a composite dielectric layer 310 which is further comprised of a bottom dielectric layer 304, a charge trapping layer 306 and a top dielectric layer 308, a control gate 312, a buried doped region 314, a dielectric layer 306 and a word line 318. On the other hand, the peripheral circuit area 320 is comprised of, for example, an isolation structure 326, an N-type well region 328, a gate dielectric layer 330 and a gate 332, and many active areas 322 and 324, divided by the isolation structure 326, where the isolation structure can be, for example, shallow trench insulating structure. However, the formation for the structure in FIG. 3A is similar to that for the previous embodiment and have already explained in details; therefore, description thereof will be mention herein. In another embodiment of the present invention, the silicide (not shown in the figures) is formed over the gate 332 and control gate 312 to reduce the resistance.

Figure 3B:
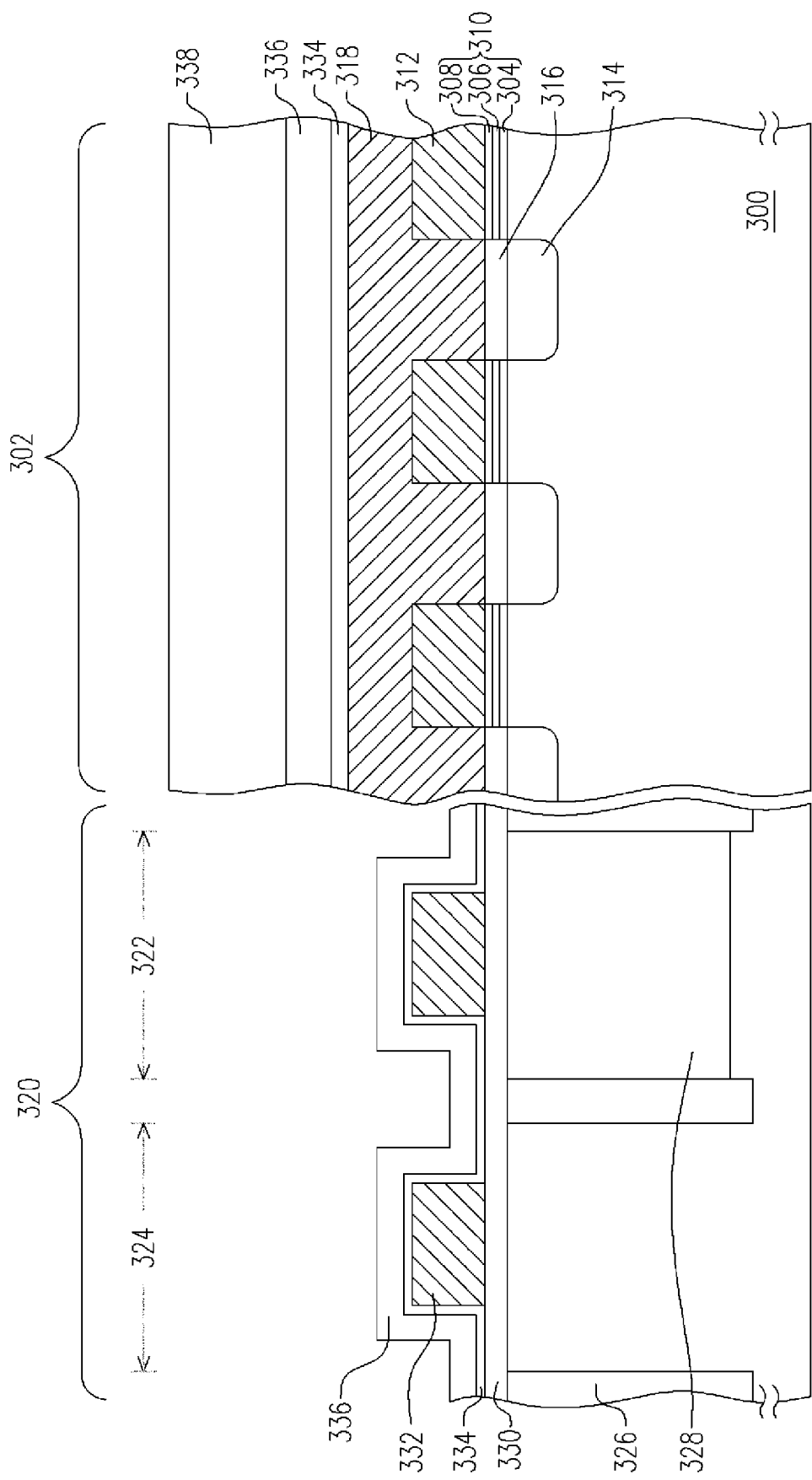

Thereafter, referring to FIG. 3B, a pad oxide layer 334 is formed over the semiconductor substrate 300 to cover word line 318 in the memory cell area 302, and the gate 332 and gate dielectric layer 330 in the peripheral circuit area 320. The material of the pad-oxide layer 334 is, for example, silicon dioxide formed by applying tetraethoxysilane (TEOS) as a reacting gas through, for example, the chemical vapour deposition. Then, a dielectric layer 336 is formed over the pad-oxide layer 334, and the material of the dielectric layer 336 is, for example, silicon nitride, the dielectric layer 336 is formed by, for example, chemical vapour deposition. A patterned photoresist 338 is formed to cover the memory cell area 302.

Figure 3C:
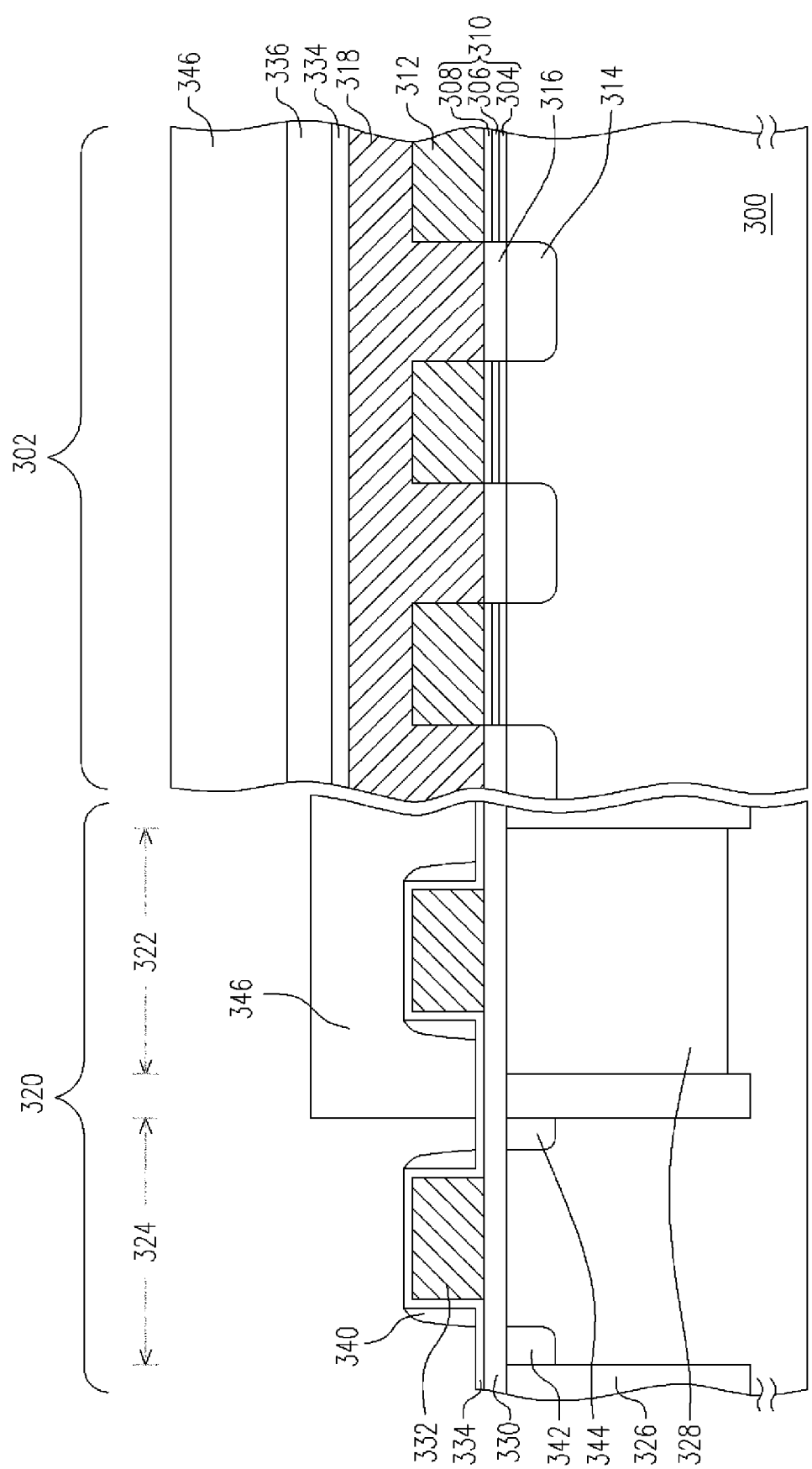

Continuing to FIG. 3C, a portion of dielectric layer 336 is removed from the peripheral circuit area 320 and formed a spacer 340 between the side walls of each gate 332 and inside the peripheral circuit 320. Where the method to remove a portion of dielectric layer 336 is to process an anisotropic etching by using the pad oxide layer 334 as etching stop layer. Then, the patterned photoresist 338 is removed. Thereafter, the photoresist layer 346 is formed to cover the memory cell area 302 and the active area 322. Furthermore, an N-type source region 342 and an N-type drain region 344 are formed by, for example an ion implantation process, beside both sides of each gate in the substrate.

Figure 3D:
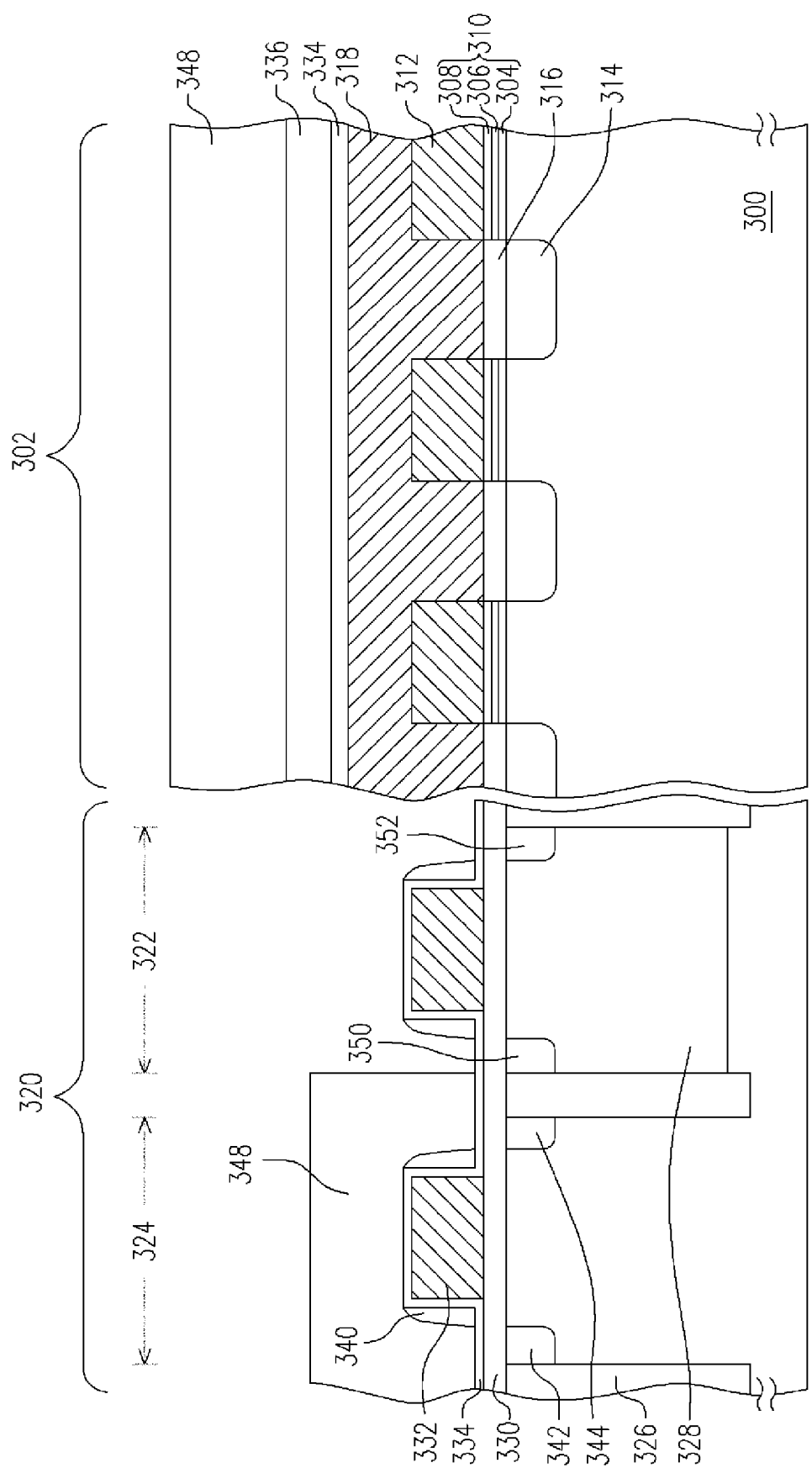

Turning next to FIG. 3D, the patterned photoresist layer 346 is removed. Then, a patterned photoresist layer 348 is formed over the semiconductor substrate 300 to cover the memory cell area 302 and the active area 324. Within the active area 322, the P type source region 350 and the P type drain region 352 are formed by, for example, an ion implantation process, beside both side walls of each gate 332 in the semiconductor substrate 300.

Figure 3E:
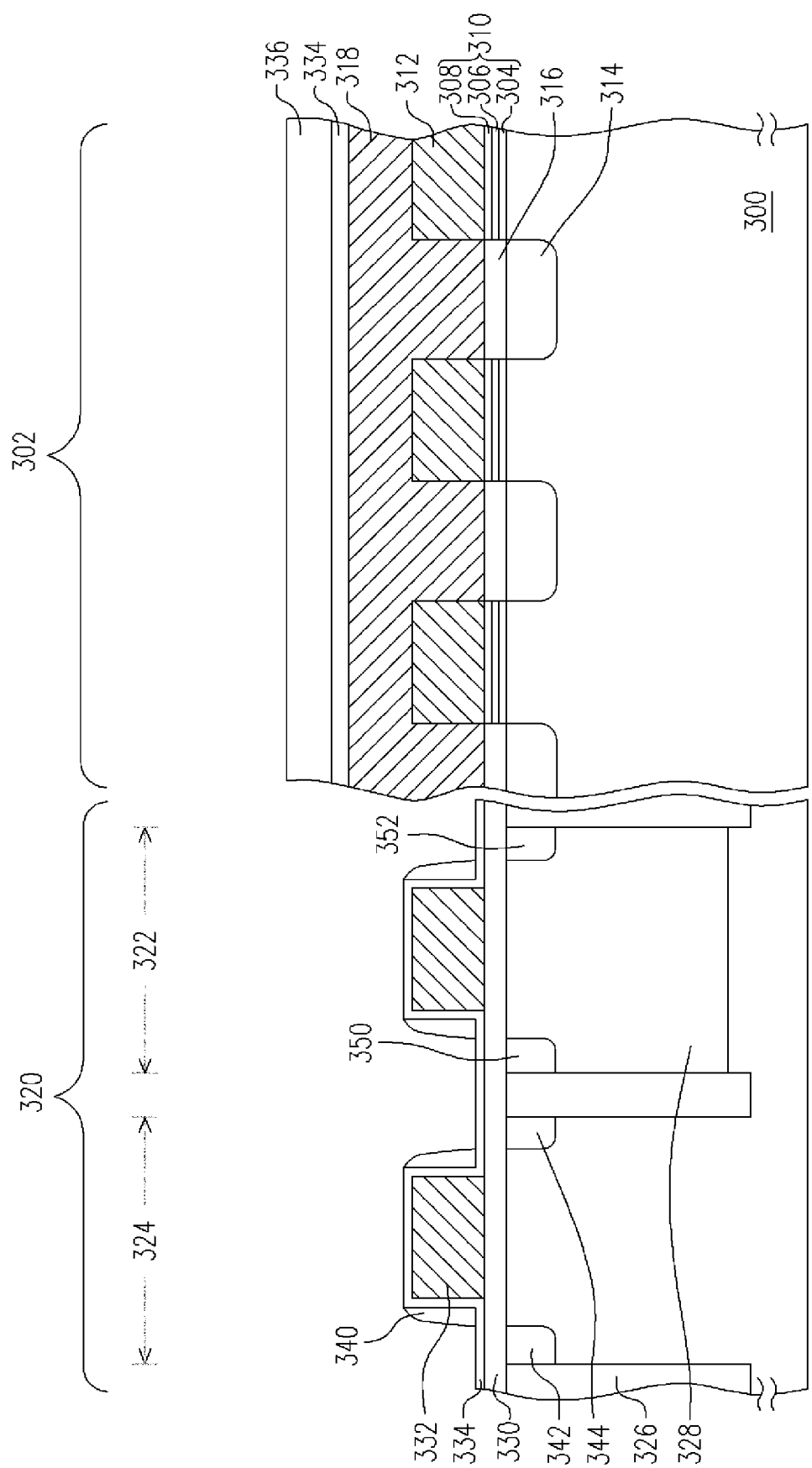

Thereafter, referring to FIG. 3E, the patterned photoresist layer 348 is removed. The following steps to fabricate the memory devices are skills well known in the art; therefore, no further details will be described herein.

According to the previous embodiment of the present invention, a spacer 340, an N-type source region 342 and an N-type drain region 344, a P-type source region 250 and a P-type drain region 252 are formed after the deposition of the dielectric layer 336. Besides, the previous mentioned processes are conducted under the protection of the patterned photoresist layers 338, 346 and 348 that cover the memory cell area 302; therefore, the memory cell area is protected from being damaged to prevent the current leakage. Further, the pad oxide layer 234 is used as an etching stop layer in this embodiment to reduce any possible damage that may be induced by an over etching.

Although the disclosure herein refers to certain illustrated embodiments of an electrically erasable programmable read only memory (EEPROM), it is to be understood that these embodiments are presented by way of example and not by way of limitation. In another embodiments, the fabrication method of the present invention can also be applied to, for example, dynamic random access memory (DRAM).

In conclusion of above description, the present invention presents at least the following advantages.

1. According to the fabrication method for a memory device of the present invention, a photoresist layer is used to protect the memory cell area during the etching process for forming the spacer. The current leakage between the bit lies due to the defects generated in the etching process, is mitigated.

2. According to the fabrication method for a memory device of the present invention, the formation of the spacers and the ion implantation process for the formation for the source area/drain area of the NMOS or the PMOS are integrated together. During the formation of the spacer, the memory cell area is protected by the photoresist layers, which are formed during the formation for the source area/drain area of NMOS or PMOS, to reduce the current leakage problem between the bit lines.

3. According to the fabrication method of a memory device of the present invention, a pad oxide layer is formed under the dielectric layer where the spacer is formed. An over etching that may damage the word line, bit line and gate area on the surface of the structure can be obviated to improve the reliability of the device.

4. According to the fabrication method for a memory device, the formation of the spacer and the ion implantation process for the formation of the source/drain region of the NMOS or PMOS. The fabrication process for a CMOS can directly apply to the formation of the source/drain region of the NMOS or PMOS; therefore, no additional cost is required.

The above descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A fabricating method of a semiconductor device, the method comprises steps of:
   providing a substrate having a memory array, and a plurality of gate structures formed within a first area and a second area;
   forming a pad oxide layer on the substrate to cover the gate structures;
   forming a dielectric layer over the pad oxide layer and covering the gate structures;
   etching the dielectric layer from the first area to form a first spacer on the side walls of the gate structures within the first area;
   forming a first source/drain region in the substrate beside the side walls of the gate structures in the first area;
   etching the dielectric layer from the second area to form a second spacer on the side walls of the gate structures in the second area; and
   forming a second source/second drain region in the substrate beside the side walls of the gate structures in the second area.

2. The method as recited in claim 1, wherein the material for the dielectric layer is including silicon nitride.

3. The method as recited in claim 1, wherein a material for constituting the pad oxide is comprised of silicon dioxide, formed with tetraethoxysilane (TEOS) is as a reacting gas.

4. The method as recited in claim 1, wherein the step of etching the dielectric layer from the first area comprises an anisotropic etching process.

5. The method as recited in claim 1, wherein thestep of etching the dielectric layer from the second area comprises an anisotropic etching process.

6. A method as recited in claim 1, wherein thestep of forming the first source/drain region comprises an ion implantation proeess.

7. A method as recited in claim 1, wherein thestep of forming the second source region/drain region comprises an ion implantation process.

8. The method as recited in claim 1, wherein the substrate comprises an isolation structure between the first and second areas.

9. The method as recited in claim 1 further comprises forming a silicide layer over the gate structures.

10. The method as recited in claim 1, wherein the gate structure comprises a gate dielectric layer and a gate.

11. A method of forming a spacer comprising:
    forming a pad oxide layer on a first group of gate structures and a second group of gate structures;
    forming a dielectric layer over the gate structures;
    removing a portion of the dielectric layer to form a first spacer on the side walls of the first group of gate structures;
    forming a first source/drain region near the side walls of the first group of gate structures;
    removing a portion of the dielectric Layer to form a second spacer on the side walls of the second group of gate structures;and
    forming a second source/drain regionnear the side walls of the second group of gate structures.

12. The method as recited in claim 11, wherein the material for the dielectric layer is including silicon nitride.

13. The method as recited in claim 11, wherein a material for constituting the pad oxide layer is comprised of silicon oxide, formed with tetraethoxysilane (TEOS) as a reacting gas.

14. The method as recited in claim 11, wherein the step of removing a portion of the dielectric layer to form a first spacer comprises an anisotropic etching process.

15. The method as recited in claim 11, wherein the step of removing a portion of the dielectric layer to form a second spacer comprises an anisotropic etching process.

16. The method as recited in claim 11, wherein the step of forming the first source region/drain region comprises an ion implantation process.

17. The method as recited in claim 11, wherein the step of forming the second source/drain region comprises an ion implantation process.

18. The method as recited in claim 11, wherein the first group of gate structures and the second group of gate structures are separated by an isolation structure.

19. The method as recited in claim 11 further comprises forming a silicide over the gate structures.

20. The method as recited in claim 11, wherein the gate structure comprise a gate dielectric layer and a gate.

* * * * *